US009859202B2

United States Patent
Hu (10) Patent No.: US 9,859,202 B2
(45) Date of Patent: Jan. 2, 2018

(54) SPACER CONNECTOR

(71) Applicant: Dyi-Chung Hu, Hsinchu (TW)

(72) Inventor: Dyi-Chung Hu, Hsinchu (TW)

( * ) Notice: Subject to any disclaimer, the term of this patent is extended or adjusted under 35 U.S.C. 154(b) by 0 days.

(21) Appl. No.: 15/190,695

(22) Filed: Jun. 23, 2016

(65) Prior Publication Data

US 2016/0379922 A1    Dec. 29, 2016

Related U.S. Application Data

(60) Provisional application No. 62/184,034, filed on Jun. 24, 2015.

(51) Int. Cl.
| | |
|---|---|
| *H05K 1/11* | (2006.01) |
| *H01L 23/498* | (2006.01) |
| *H01L 21/48* | (2006.01) |
| *H01L 25/10* | (2006.01) |

(52) U.S. Cl.
CPC ...... *H01L 23/49838* (2013.01); *H01L 21/486* (2013.01); *H01L 21/4846* (2013.01); *H01L 23/49827* (2013.01); *H01L 25/105* (2013.01); *H01L 2224/16227* (2013.01); *H01L 2225/107* (2013.01); *H01L 2225/1023* (2013.01); *H01L 2924/15313* (2013.01); *H01L 2924/15331* (2013.01)

(58) Field of Classification Search
CPC .. H05K 1/02; H05K 1/03; H05K 1/09; H05K 1/11; H05K 1/14; H05K 1/16; H05K 1/18; H05K 3/00; H05K 3/30; H05K 3/32; H05K 3/36; H05K 3/40; H01L 21/02; H01L 21/48; H01L 21/50; H01L 21/56; H01L 21/60; H01L 23/00; H01L 23/02; H01L 23/12; H01L 23/14; H01L 23/28; H01L 23/31; H01L 23/48; H01L 23/52
USPC ....... 174/262, 251, 252, 255, 258, 260, 261, 174/265; 257/675, 676, 686, 741, 758, 257/774, 777, 778, 787; 361/306.3, 752, 361/760, 773, 783; 29/830, 841
See application file for complete search history.

(56) References Cited

U.S. PATENT DOCUMENTS

| | | | | |
|---|---|---|---|---|
| 6,366,467 | B1 * | 4/2002 | Patel | H05K 1/141 257/691 |
| 9,202,742 | B1 * | 12/2015 | Kim | H01L 23/49827 |
| 9,376,541 | B2 * | 6/2016 | Kang | C08K 3/08 |
| 2002/0179331 | A1 * | 12/2002 | Brodsky | H05K 3/325 174/262 |
| 2003/0160325 | A1 * | 8/2003 | Yoneda | H01L 21/4846 257/758 |
| 2004/0017672 | A1 * | 1/2004 | Matsuda | H01L 23/13 361/767 |
| 2004/0173891 | A1 * | 9/2004 | Imai | H01L 23/49827 257/686 |
| 2004/0178508 | A1 * | 9/2004 | Nishimura | H01L 23/3128 257/778 |

(Continued)

*Primary Examiner* — Xiaoliang Chen
(74) *Attorney, Agent, or Firm* — JCIPRNET (57) ABSTRACT

A fabricating process for a spacer connector is disclosed. A core substrate with a plurality of through holes is prepared. A conductive carrier with a dielectric adhesive configured on a top surface is prepared. The core substrate is then pasted on a top surface of the dielectric adhesive layer. The dielectric adhesive exposed in the through hole is then etched. An electric plating process to form metal pillar in the core substrate is performed using the conductive carrier as one of the electrode.

9 Claims, 14 Drawing Sheets

(56) References Cited

U.S. PATENT DOCUMENTS

| | | | | |
|---|---|---|---|---|
| 2004/0184219 A1* | 9/2004 | Otsuka | H01L 23/49805 | 361/306.3 |
| 2004/0227258 A1* | 11/2004 | Nakatani | H01L 23/49805 | 257/787 |
| 2005/0184381 A1* | 8/2005 | Asahi | H01R 13/2414 | 257/693 |
| 2005/0194672 A1* | 9/2005 | Gibson | H05K 1/112 | 257/686 |
| 2006/0055017 A1* | 3/2006 | Cho | H01L 25/105 | 257/686 |
| 2006/0091538 A1* | 5/2006 | Kabadi | H05K 7/1061 | 257/737 |
| 2006/0180938 A1* | 8/2006 | Kurihara | H01L 21/4853 | 257/773 |
| 2007/0057685 A1* | 3/2007 | Garabedian | G01R 1/07371 | 324/754.18 |
| 2007/0075717 A1* | 4/2007 | Kinghorn | G01R 1/07378 | 324/754.18 |
| 2007/0090534 A1* | 4/2007 | Iwasaki | H01L 23/5385 | 257/777 |
| 2007/0215380 A1* | 9/2007 | Shibamoto | H01L 23/3128 | 174/260 |
| 2008/0155820 A1* | 7/2008 | Arai | H01L 21/565 | 29/830 |
| 2008/0157326 A1* | 7/2008 | Han | H05K 3/3436 | 257/686 |
| 2009/0108425 A1* | 4/2009 | Lee | H01L 23/3128 | 257/679 |
| 2009/0145636 A1* | 6/2009 | Miki | H01L 21/6835 | 174/255 |
| 2010/0025081 A1* | 2/2010 | Arai | H01L 21/4857 | 174/251 |
| 2011/0080713 A1* | 4/2011 | Sunohara | H01L 23/147 | 361/760 |
| 2012/0119370 A1* | 5/2012 | Yoo | H01L 23/15 | 257/773 |
| 2012/0147578 A1* | 6/2012 | Jin | H01F 19/04 | 361/774 |
| 2012/0193812 A1* | 8/2012 | Toh | H01L 21/561 | 257/774 |
| 2012/0211885 A1* | 8/2012 | Choi | H01L 23/3128 | 257/737 |
| 2012/0326334 A1* | 12/2012 | Sakaguchi | H01L 23/147 | 257/778 |
| 2013/0001798 A1* | 1/2013 | Choi | H01L 23/481 | 257/774 |
| 2013/0027895 A1* | 1/2013 | Hayashi | H01L 23/145 | 361/760 |
| 2013/0037964 A1* | 2/2013 | Lee | H01L 23/481 | 257/774 |
| 2013/0111123 A1* | 5/2013 | Thayer | G06F 13/16 | 711/105 |
| 2013/0147026 A1* | 6/2013 | Topacio | H01L 25/105 | 257/698 |
| 2013/0320568 A1* | 12/2013 | Aoki | H01L 24/09 | 257/777 |
| 2014/0001639 A1* | 1/2014 | Hiraishi | H01L 23/48 | 257/773 |
| 2014/0085850 A1* | 3/2014 | Li | H05K 1/0231 | 361/773 |
| 2014/0092569 A1* | 4/2014 | Sakurai | H05K 3/4697 | 361/752 |
| 2014/0117557 A1* | 5/2014 | Chen | H01L 23/49822 | 257/774 |
| 2014/0157593 A1* | 6/2014 | Lin | H01L 24/19 | 29/832 |
| 2014/0167263 A1* | 6/2014 | Wu | H01L 21/565 | 257/741 |
| 2014/0252561 A1* | 9/2014 | Lisk | H01L 23/5384 | 257/621 |
| 2015/0061095 A1* | 3/2015 | Choi | H01L 24/20 | 257/675 |
| 2015/0061101 A1* | 3/2015 | Le | H01L 25/0655 | 257/676 |
| 2015/0102485 A1* | 4/2015 | Kang | C08K 3/08 | 257/737 |
| 2015/0115466 A1* | 4/2015 | Kim | H01L 23/49811 | 257/774 |
| 2015/0115467 A1* | 4/2015 | Park | H05K 1/141 | 257/774 |
| 2015/0214207 A1* | 7/2015 | Yoshida | H01L 25/0657 | 438/109 |
| 2015/0255412 A1* | 9/2015 | Meyer | G06F 1/1613 | 361/679.55 |
| 2016/0027712 A1* | 1/2016 | Hu | H01L 23/49833 | 174/262 |
| 2016/0027764 A1* | 1/2016 | Kim | H01L 24/97 | 257/686 |

* cited by examiner

SPACER CONNECTOR

RELATED APPLICATIONS

The present application claims the benefit of U.S. Provisional Application No. 62/184,034, filed Jun. 24, 2015, the disclosure of which is hereby incorporated by reference herein in its entirety.

BACKGROUND

Technical Field

The present invention relates to a fabricating process for making a spacer connector, especially using a conductive carrier in an initial step of the fabrication process.

Description of Related Art

One of the traditional processes for fabricating metal circuitry, a seed layer is often applied before electric plating. In a later process, the seed layer needs to be stripped. However, the stripping of the seed layer reduces the size of the circuits. Although such a circuit reduction is tiny, it is critical when it comes to nanotechnology. A fabricating process without reducing the dimension of a circuitry is one of the popular topics to study for a long time in the semiconductor industry.

BRIEF DESCRIPTION OF THE DRAWINGS

FIGS. 1A~7A show a fabricating process for a first embodiment according the present invention.

FIGS. 9A~10A show some steps in a fabricating process for a second embodiment according the present invention.

FIG. 10B shows a second embodiment according to the present invention.

FIGS. 12A~13A show some steps in a fabricating process for a third embodiment according the present invention.

DETAILED DESCRIPTION OF THE INVENTION

A fabricating process for making a spacer connector without using seed layer is disclosed.

FIGS. 1A~7A show a fabricating process for a first embodiment according the present invention.

Figure 1A:
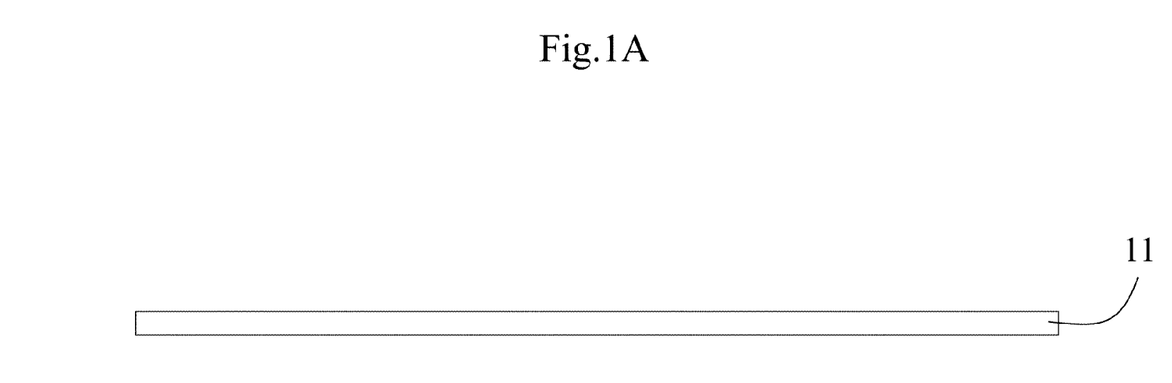

FIG. 1A shows that a core substrate 11 is prepared. The core substrate 11 is made of a material of glass or silicon.

Figure 1B:
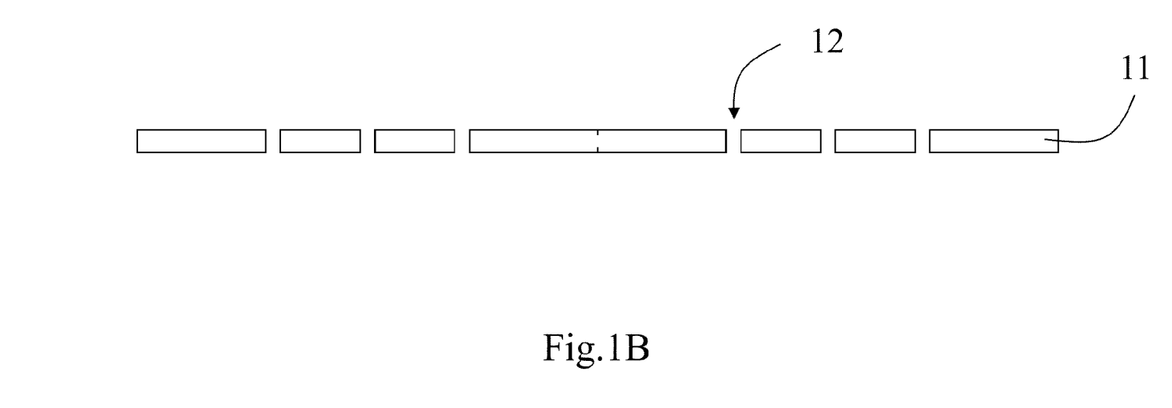

FIG. 1B shows a plurality of openings 12 is made through the core substrate 11.

Figure 2:
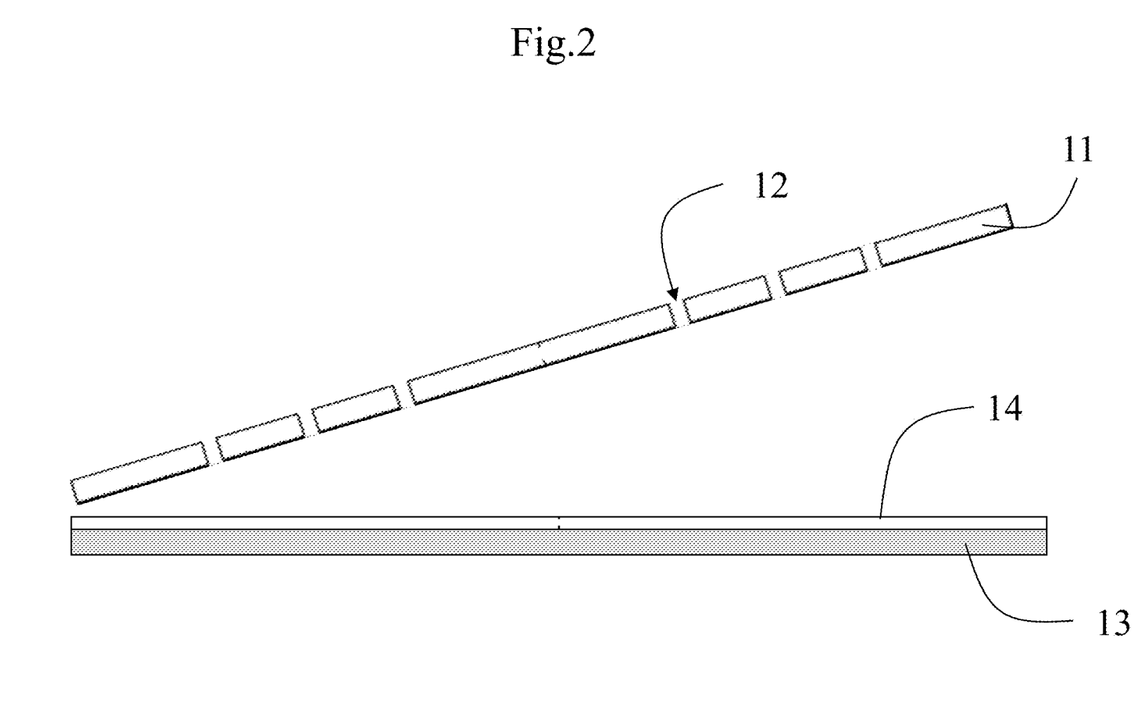

FIG. 2 shows a temporary conductive carrier 13 is prepared. A dielectric adhesive 14 is applied on a top surface of the conductive carrier 13. The core substrate 11 with through holes 12 is pasted onto the dielectric adhesive 14.

Figure 3A:
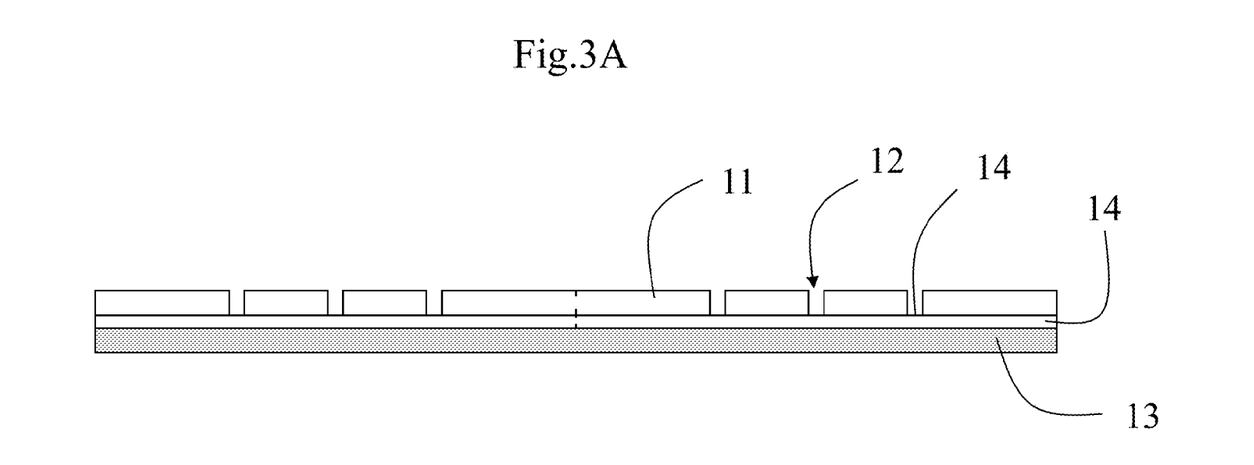

FIG. 3A shows that the core substrate 11 is configured on a top surface of the dielectric adhesive 14.

Figure 3B:
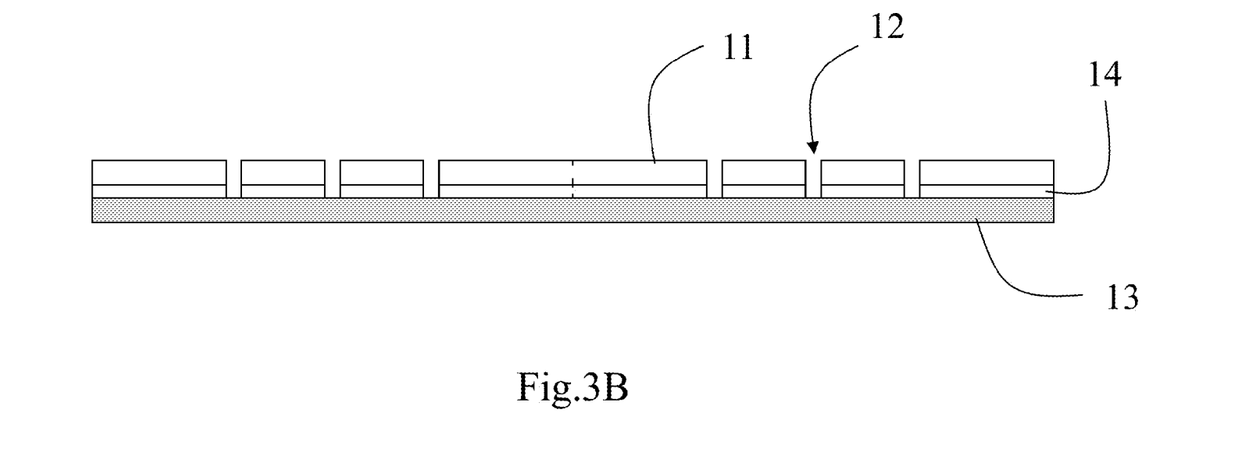

FIG. 3B shows that the dielectric adhesive 14 on a bottom of each through holes 12 is etched, and a top surface of the conductive carrier 13 is exposed.

Figure 4A:
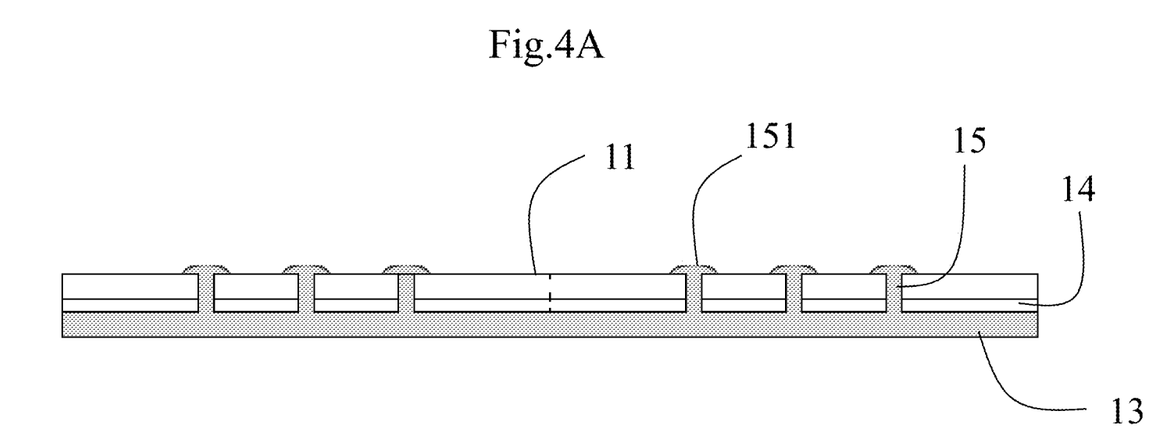

FIG. 4A shows copper plating is performed using the conductive carrier 13 as one of the electrode. Copper pillar 15 is formed staring from the exposed conductive carrier in each through holes 12. A metal head 151 is configured on a top of the copper pillar 15.

Figure 4B:
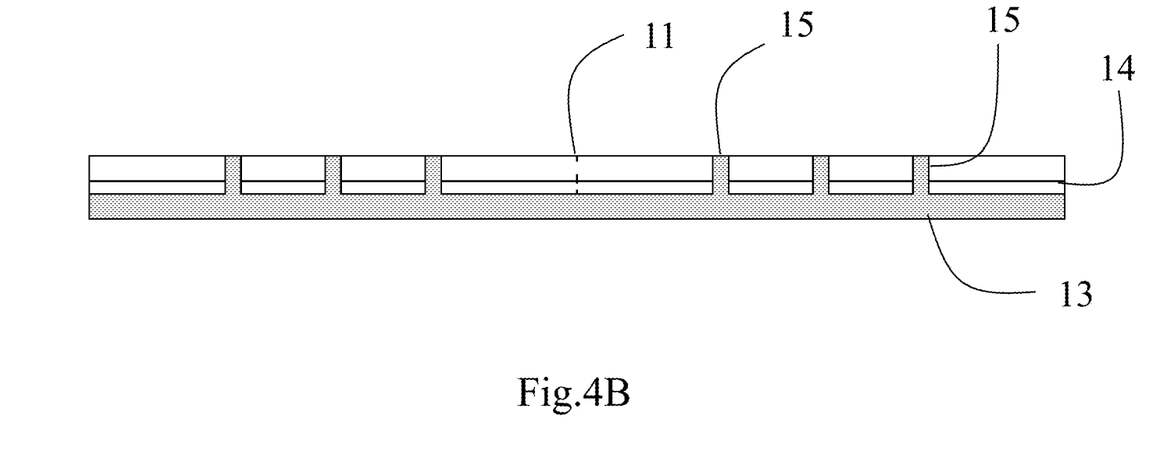

FIG. 4B shows the metal heads 151 are removed.

Figure 5A:
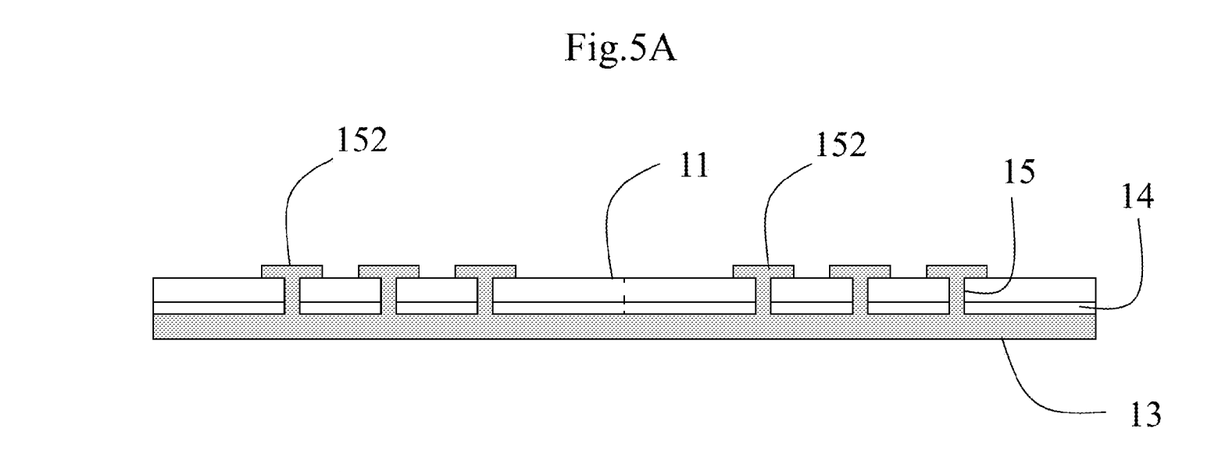

FIG. 5A shows that top metal pad 152 is formed.

Figure 5B:
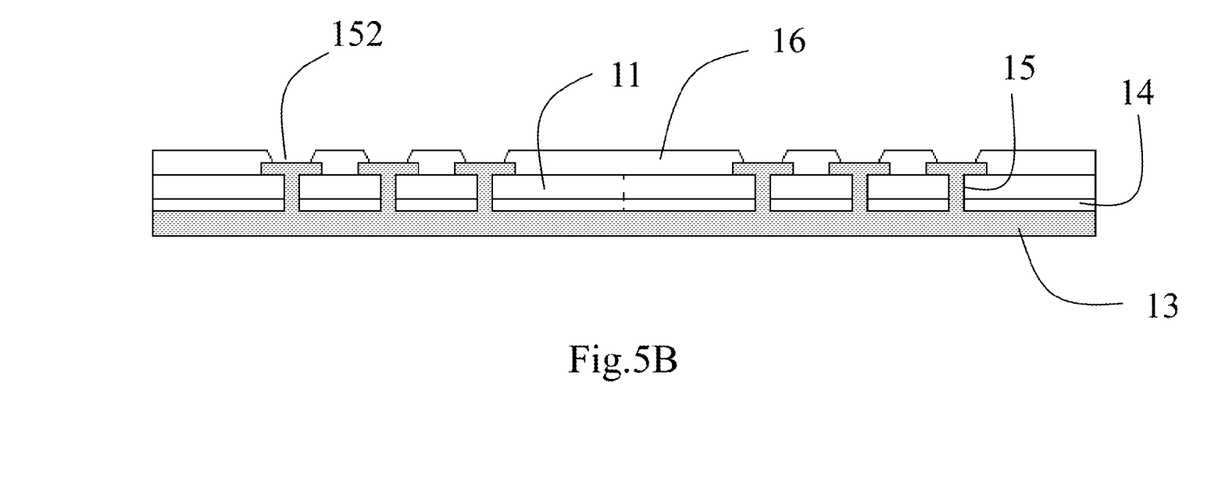

FIG. 5B shows that a passivation 16 is formed on a top of the core substrate 11. The passivation 16 also covers peripheral area of each top metal pad 152 and a central portion of the top metal pad 152 is exposed for electrical connection.

Figure 6A:
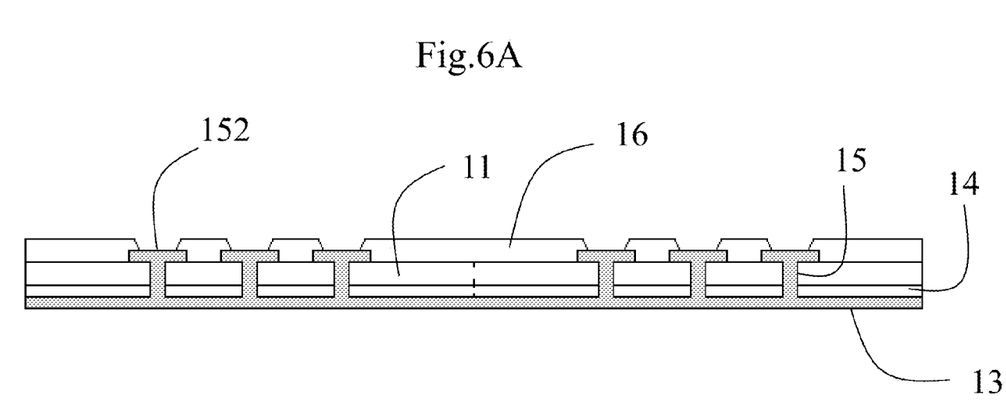

FIG. 6A shows thinning process is performed from a bottom the temporary conductive carrier 13.

Figure 6B:
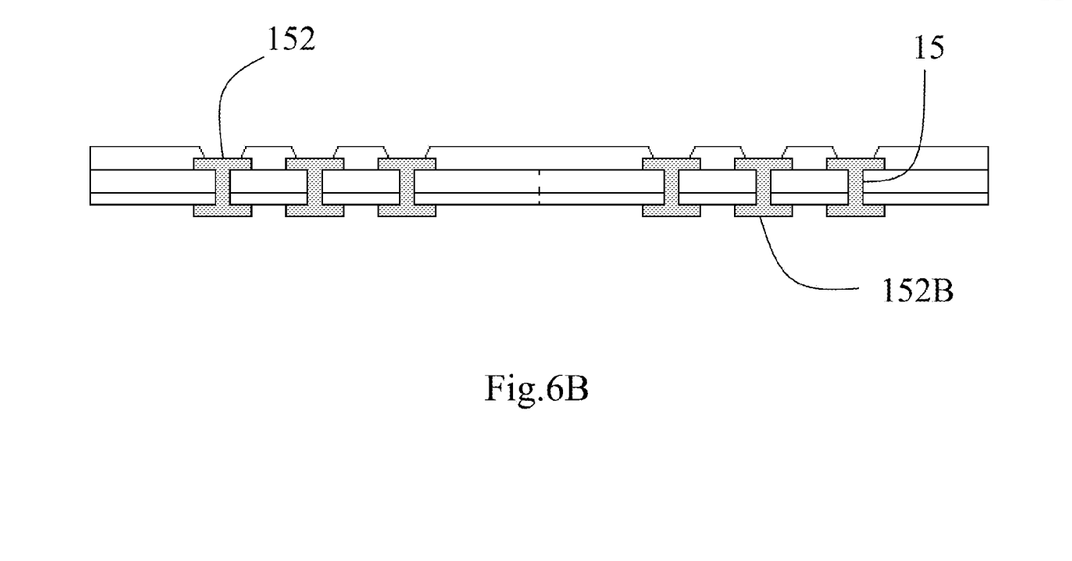

FIG. 6B show etching process is performed to the conductive carrier 13 to form a plurality of bottom metal pads 152B. Each of the bottom metal pads 152B is configured on a bottom of a corresponding metal pillar 15.

Figure 7A:
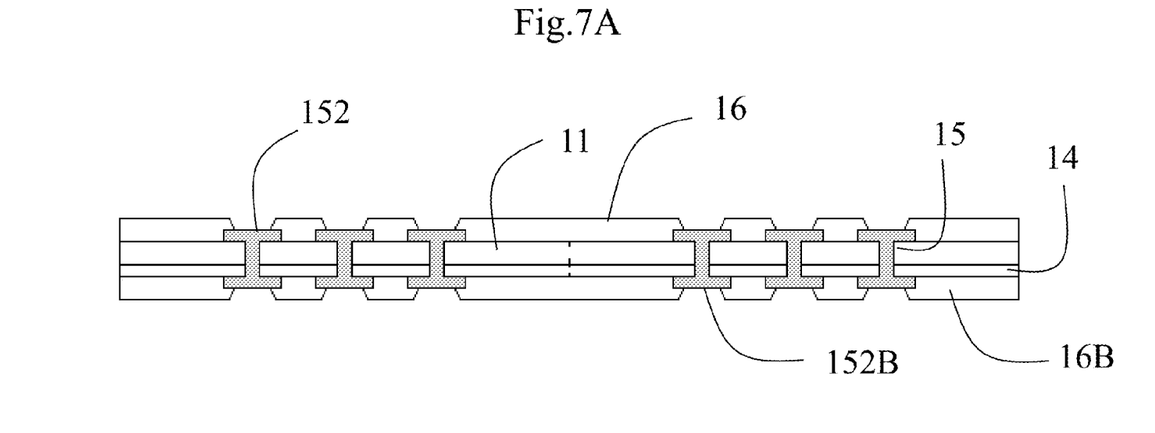

FIG. 7A shows a bottom passivation 16B is formed on a bottom surface of the dielectric adhesive 14. The bottom passivation 16B also covers peripheral area of each bottom metal pad 152B and a central portion of the bottom metal pad 152B is exposed for electrical connection.

Figure 7B:
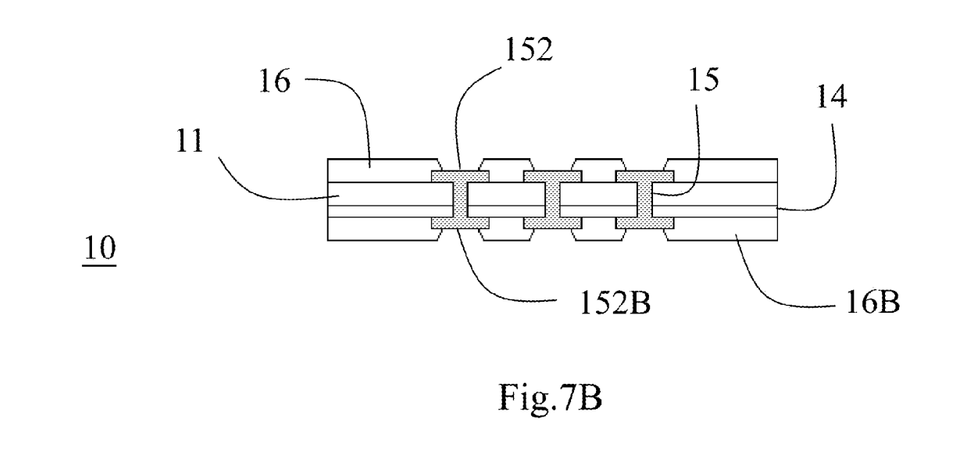
FIG. 7B shows a first embodiment according to the present invention.

FIG. 7B shows a first embodiment according to the present invention.

FIG. 7B shows a first embodiment of the spacer connector 10 is produced after a singulation process performed on a product of FIG. 7A.

Figure 8:
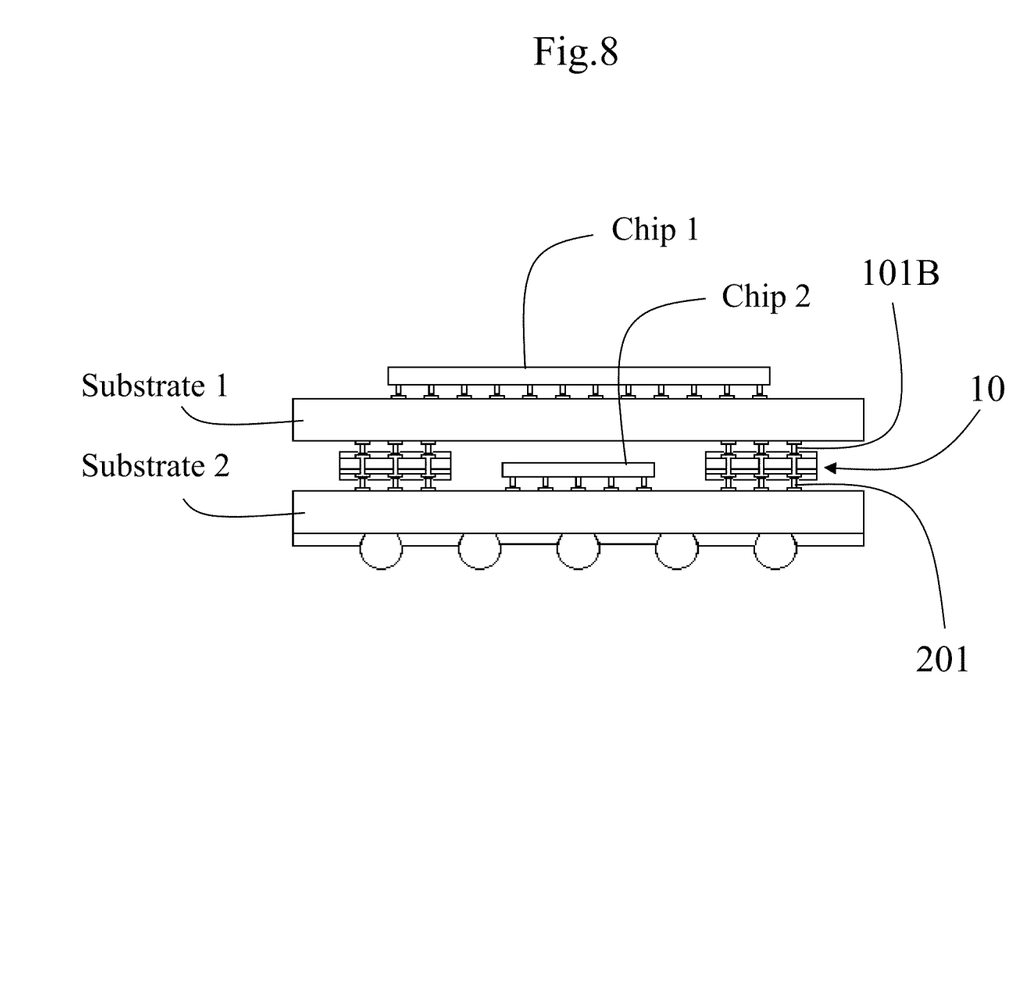
FIG. 8 shows an application for the first spacer connector according to the present invention.

FIG. 8 shows an application for the first spacer connector according to the present invention.

FIG. 8 shows two spacer connectors 10 are configured in between package substrate 1 and package substrate 2. FIG. 8 shows chip 1 is configured on a top center of package substrate 1. Chip 2 is configured on a top center of package substrate 2. Package substrate 1 is stacked on a top of package substrate 2.

The package substrate 1 has a plurality of bottom metal pillars 101B, each metal pillar 101B is electrically coupled to a corresponding top metal pad 152 of the spacer connector 10. The package substrate 2 has a plurality of top metal pillars 201, each metal pillar 201 is electrically coupled to a corresponding bottom metal pad 152B of the spacer connector 10.

FIGS. 1A~5B, 9A~10A show a fabricating process for a second embodiment according the present invention.

FIGS. 1A~5B have been described in previous paragraphs and are omitted for simplification.

Figure 9A:
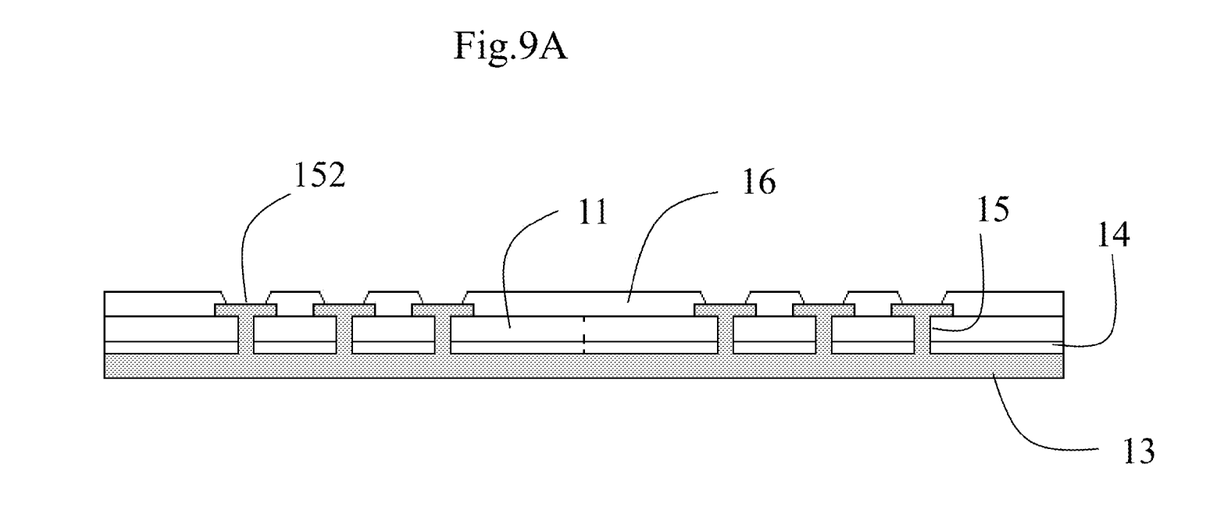

FIG. 9A is the same of the product of FIG. 5B which is a product prepared according to process FIGS. 1A~5A.

Figure 9B:
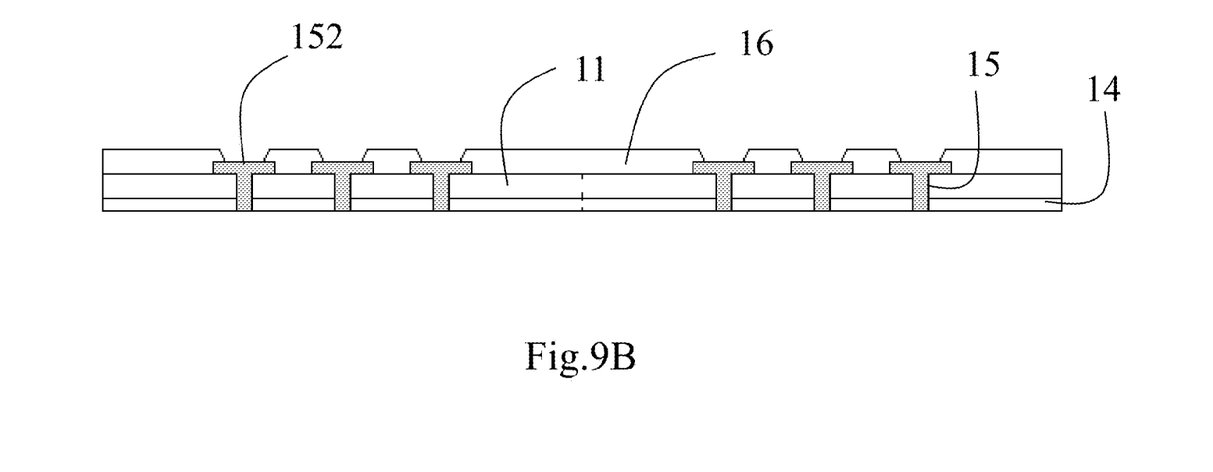

FIG. 9B shows the conductive carrier 13 is stripped. The dielectric adhesive 14 is revealed.

Figures 10A, 10B:
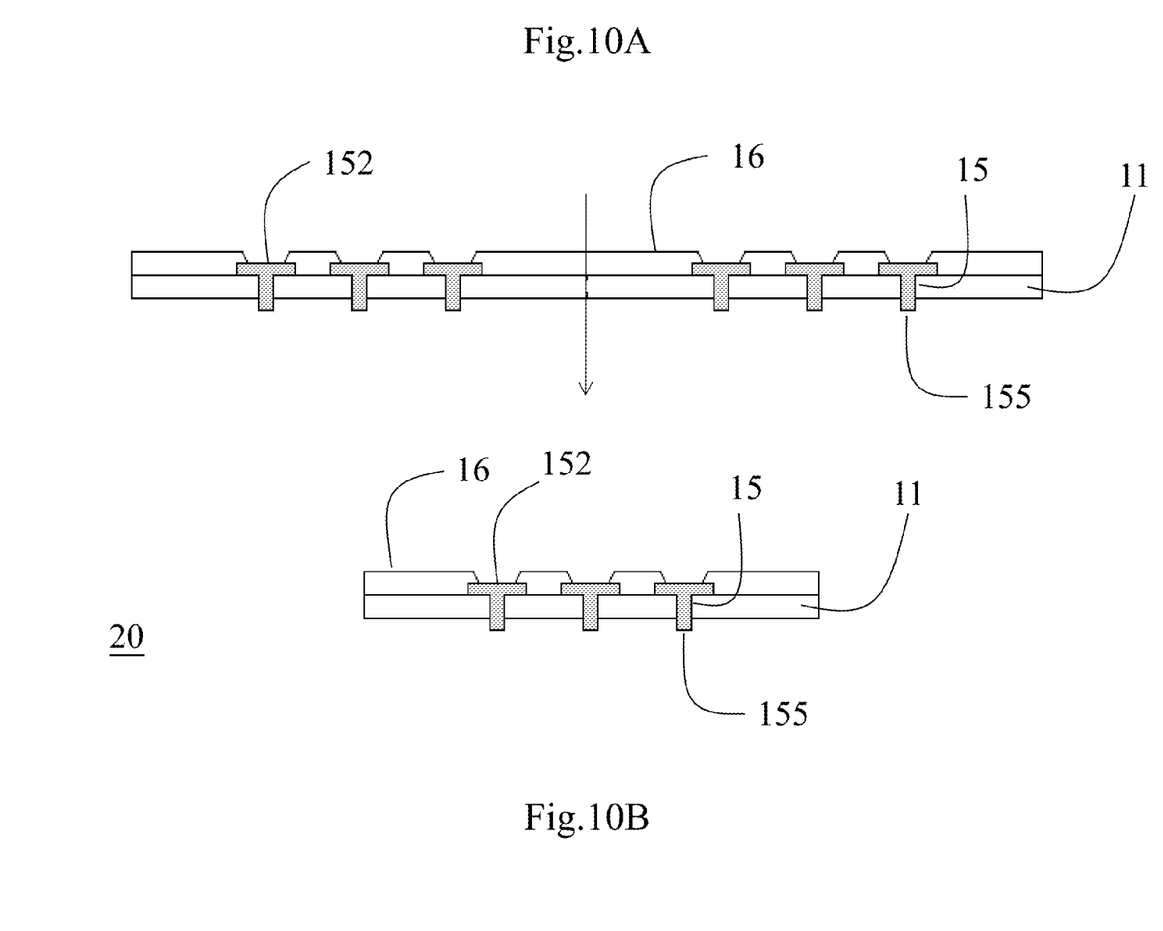

FIG. 10A shows the dielectric adhesive 14 is stripped. A bottom end 155 of the copper pillar 15 protruded below a bottom surface of the core substrate 11.

FIG. 10B shows a second embodiment according to the present invention.

FIG. 10B shows a second embodiment of the spacer connector 20 is produced after a singulation process is performed on the product of FIG. 10A.

Figure 11:
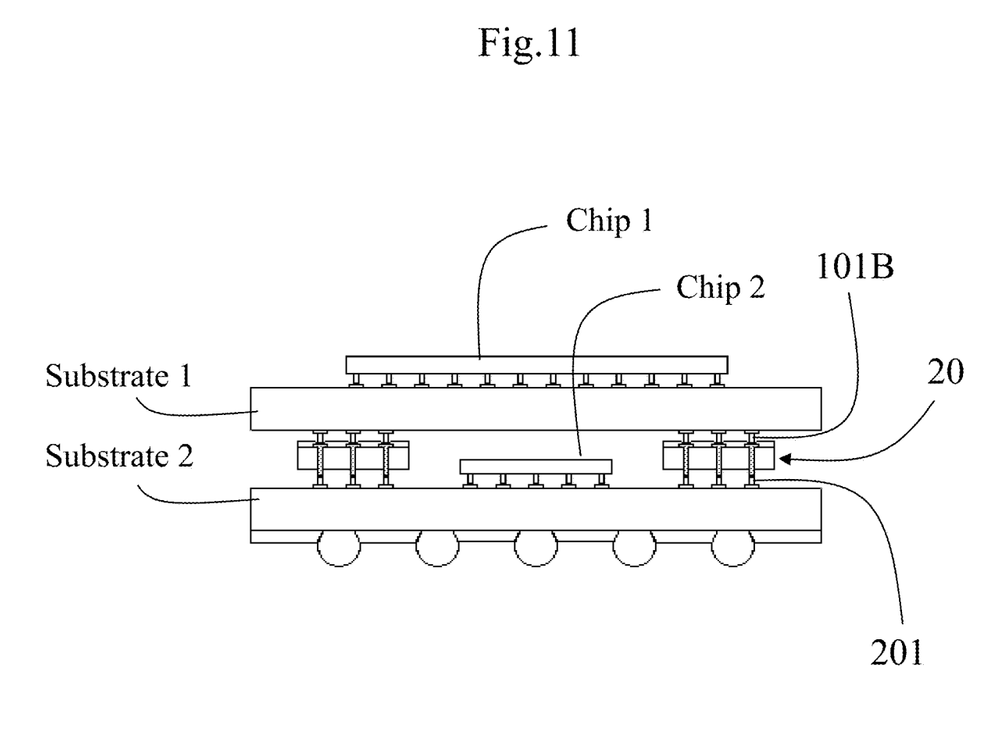
FIG. 11 shows an application for the second spacer connector according to the present invention.

FIG. 11 shows an application for the second spacer connector according to the present invention.

FIG. 11 shows two spacer connectors 20 are configured in between substrate 1 and substrate 2. FIG. 11 shows chip 1 is configured on a top center of substrate 1. Chip 2 is configured on a top center of substrate 2. Substrate 1 is stacked on a top of substrate 2.

FIGS. 1A~5B, 12A~13A show a fabricating process for a third embodiment according the present invention.

FIGS. 1A~5B have been described in previous paragraphs and are omitted for simplification.

Figure 12A:
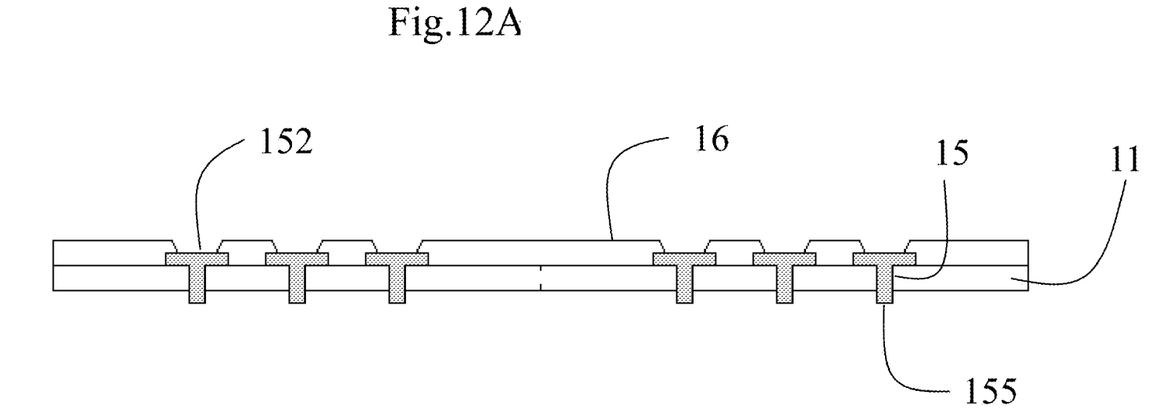

FIG. 12A is the same of the product of FIG. 10A.

Figure 12B:
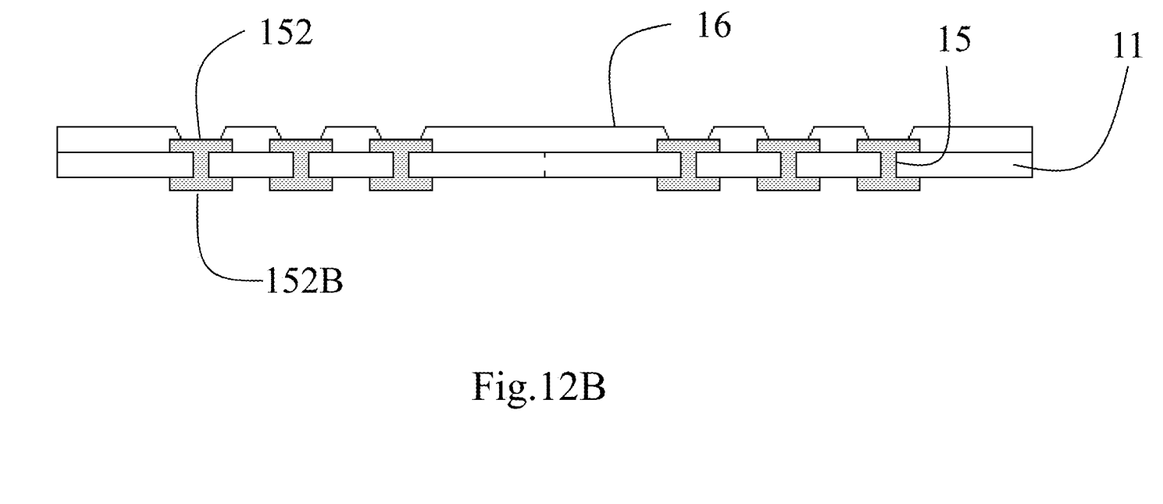

FIG. 12B shows a plurality of bottom metal pads 152B is formed. Each bottom metal pads 152B is configured on a bottom of a corresponding copper pillar 15.

Figure 13A:
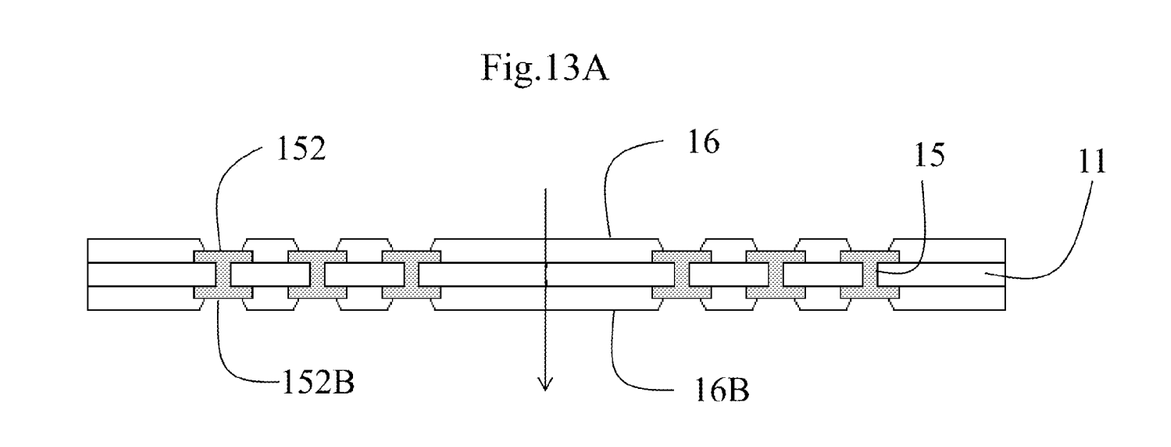

FIG. 13A shows a bottom passivation 16B is formed on a bottom surface of the core substrate 11. The bottom passivation 16B also covers peripheral area of each bottom metal pad 152B and a central portion of the bottom metal pad 152B is exposed for electrical connection.

Figure 13B:
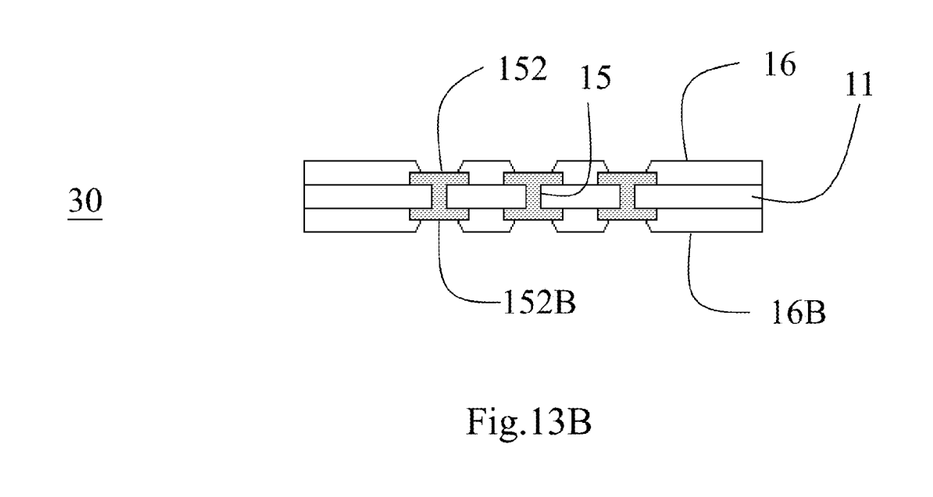
FIG. 13B shows a third embodiment according to the present invention.

FIG. 13B shows a third embodiment according to the present invention.

FIG. 13B shows a second embodiment of the spacer connector 30 is produced after a singulation process is performed on the product of FIG. 13A.

Figure 14:
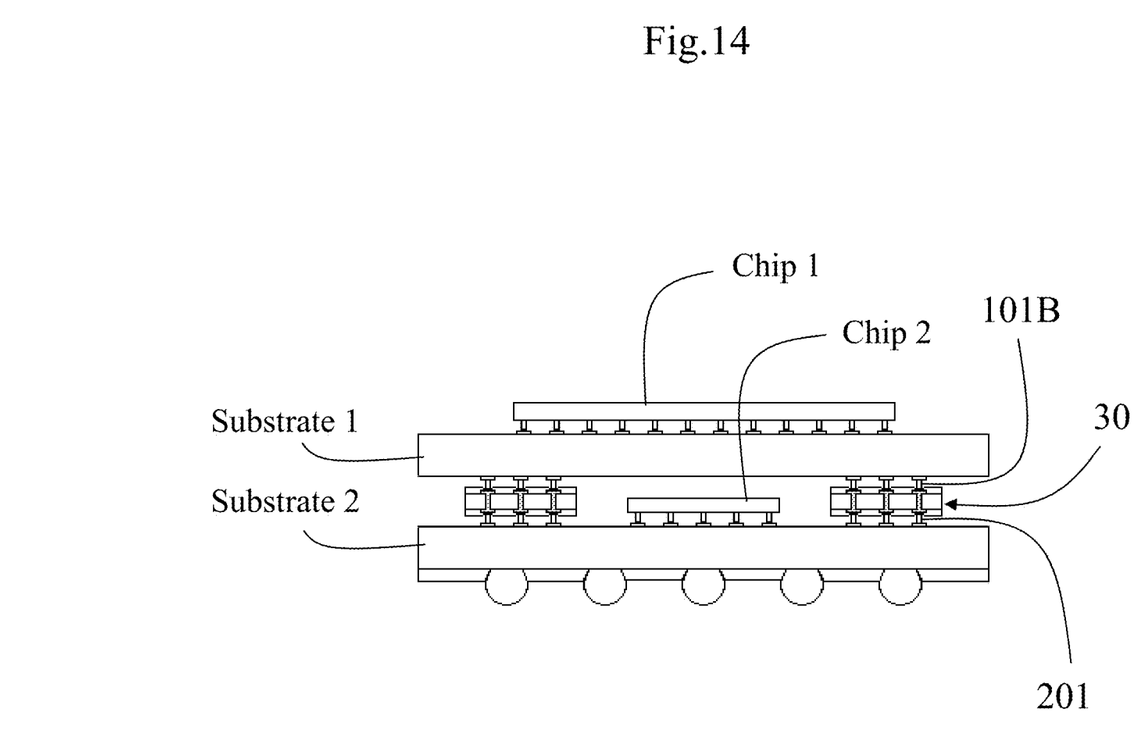
FIG. 14 shows an application for the third spacer connector according to the present invention.

FIG. 14 shows an application for the third spacer connector according to the present invention.

FIG. 14 shows two spacer connectors 30 are configured in between substrate 1 and substrate 2. FIG. 11 shows chip 1 is configured on a top center of substrate 1. Chip 2 is configured on a top center of substrate 2. Substrate 1 is stacked on a top of substrate 2.

While several embodiments have been described by way of example, it will be apparent to those skilled in the art that various modifications may be configured without departs from the spirit of the present invention. Such modifications are all within the scope of the present invention, as defined by the appended claims.

What is claimed is:

1. A structure, comprising:
   a bottom package substrate;
   a top package substrate stacked on top of the bottom package substrate;
   at least one spacer connector interposed between the bottom package substrate and the top package substrate to define a space between the bottom package substrate and the top package substrate, wherein the spacer connector comprises
      a core substrate;
      a plurality of metal pillars, each passing through the core substrate; and
      a plurality of top metal pads, each on a top end of a corresponding metal pillar among the plurality of metal pillars;
      wherein a bottom end of each metal pillar among the plurality of metal pillars protrudes downwardly from a bottom surface of the core substrate,
   the top package substrate has, on a bottom surface thereof, a plurality of bottom metal pillars each coupled to a corresponding metal pillar among the plurality of metal pillars of the spacer connector,
   the bottom package substrate has, on a top surface thereof, a plurality of top metal pillars each coupled to a corresponding metal pillar among the plurality of metal pillars of the spacer connector, and
   the top package substrate is electrically coupled to the bottom package substrate through the plurality of bottom metal pillars of the top package substrate, the plurality of metal pillars of the spacer connector, and the plurality of top metal pillars of the bottom package substrate; and
   a bottom chip arranged in the space between the bottom package substrate and the top package substrate, wherein
   the bottom chip is mounted to the top surface of the bottom package substrate, and
   the at least one spacer connector comprises two spacer connectors arranged on opposite sides of the bottom chip.

2. The structure of claim 1, wherein
   a top surface of the bottom chip is spaced downwardly from the bottom surface of the top package substrate.

3. The structure of claim 2, further comprising:
   a top chip mounted to the top surface of the top package substrate,
   wherein in a direction in which the top package substrate is stacked on top of the bottom package substrate, the top chip overlaps the bottom chip and each of the two spacer connectors.

4. The structure of claim 1, wherein
   each bottom metal pillar among the plurality of bottom metal pillars of the top package substrate is aligned with a corresponding metal pillar among the plurality of metal pillars of the spacer connector, and with a corresponding top metal pillar among the plurality of top metal pillars of the bottom package substrate.

5. The structure of claim 4, wherein
   the spacer connector is free of metal pads on the bottom ends of the plurality of metal pillars protruding downwardly from the bottom surface of the core substrate, and
   each metal pillar among the plurality of metal pillars and the corresponding top metal pad of the spacer connector form a T shape.

6. The structure of claim 4, wherein
   the bottom ends of the plurality of metal pillars protruding downwardly from the bottom surface of the core substrate of the spacer connector are connected, in an end-to-end manner, to corresponding top ends of the plurality of top metal pillars of the bottom package substrate, and
   bottom ends of the plurality of bottom metal pillars of the top package substrate are connected to the corresponding top ends of the plurality of metal pillars of the spacer connector via the corresponding top metal pads of the spacer connector.

7. The structure of claim 4, wherein
   the spacer connector further comprises a dielectric layer on the bottom surface of the core substrate, and
   the plurality of metal pillars pass through the core substrate and the dielectric layer.

8. The structure of claim 7, wherein
   the dielectric layer is a dielectric adhesive in which the core substrate is pasted.

9. The structure of claim 4, wherein
   the spacer connector further comprises a plurality of bottom metal pads, each on the bottom end of a corresponding metal pillar among the plurality of metal pillars,
   the bottom ends of the plurality of metal pillars are connected to corresponding top ends of the plurality of top metal pillars of the bottom package substrate via the corresponding bottom metal pads of the spacer connector, and
   bottom ends of the plurality of bottom metal pillars of the top package substrate are connected to the corresponding top ends of the plurality of metal pillars of the spacer connector via the corresponding top metal pads of the spacer connector.

* * * * *